US007038279B2

(12) United States Patent
Kraz et al.

(10) Patent No.: US 7,038,279 B2
(45) Date of Patent: May 2, 2006

(54) PROCESS PARAMETER EVENT MONITORING SYSTEM AND METHOD FOR PROCESS

(75) Inventors: Vladimir Kraz, Santa Cruz, CA (US); Kirk Alan Martin, Aptos, CA (US)

(73) Assignee: Credence Technologies, Inc., Soquel, CA (US)

( * ) Notice: Subject to any disclaimer, the term of this patent is extended or adjusted under 35 U.S.C. 154(b) by 64 days.

(21) Appl. No.: 10/282,771

(22) Filed: Oct. 28, 2002

(65) Prior Publication Data

US 2004/0082083 A1    Apr. 29, 2004

(51) Int. Cl.
*H01L 23/62* (2006.01)
(52) U.S. Cl. ...................... 257/355; 700/121; 700/109; 700/108

(58) Field of Classification Search ................ 257/355, 257/356–363, 549; 700/121; 29/25.01; 438/5, 6, 10, 11, 14, 17, 18, 381, 466–467
See application file for complete search history.

(56) References Cited

U.S. PATENT DOCUMENTS 6,440,178 B1 *   8/2002   Berner et al. ............... 29/25.01
6,647,309 B1 *  11/2003   Bone ............................ 700/121
6,781,205 B1 *   8/2004   Levit et al. .................. 257/355

* cited by examiner

*Primary Examiner*—Michael Lebentritt
(74) *Attorney, Agent, or Firm*—DLA Piper Rudnick Gray Cary US LLP

(57) ABSTRACT

A system and method for measuring process parameters in a process machine is described. The system is synchronized to the operation of the process machine so that spurious process parameters events are filtered out.

28 Claims, 6 Drawing Sheets

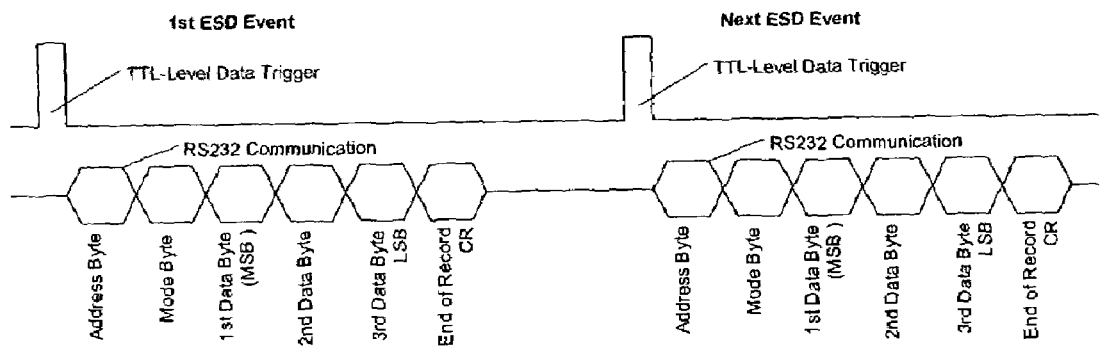
Figure 4. Data Packets Structure from ESD System to the Handler
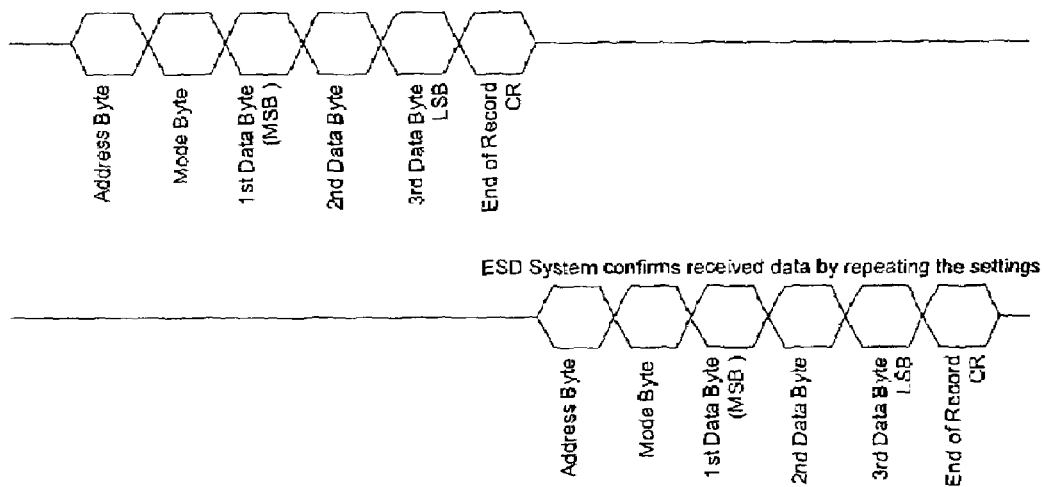
Figure 5. Setting Thresholds
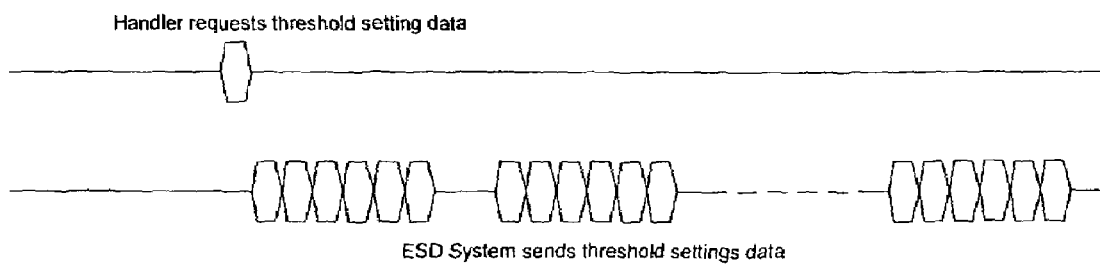
Figure 6. Reading threshold settings

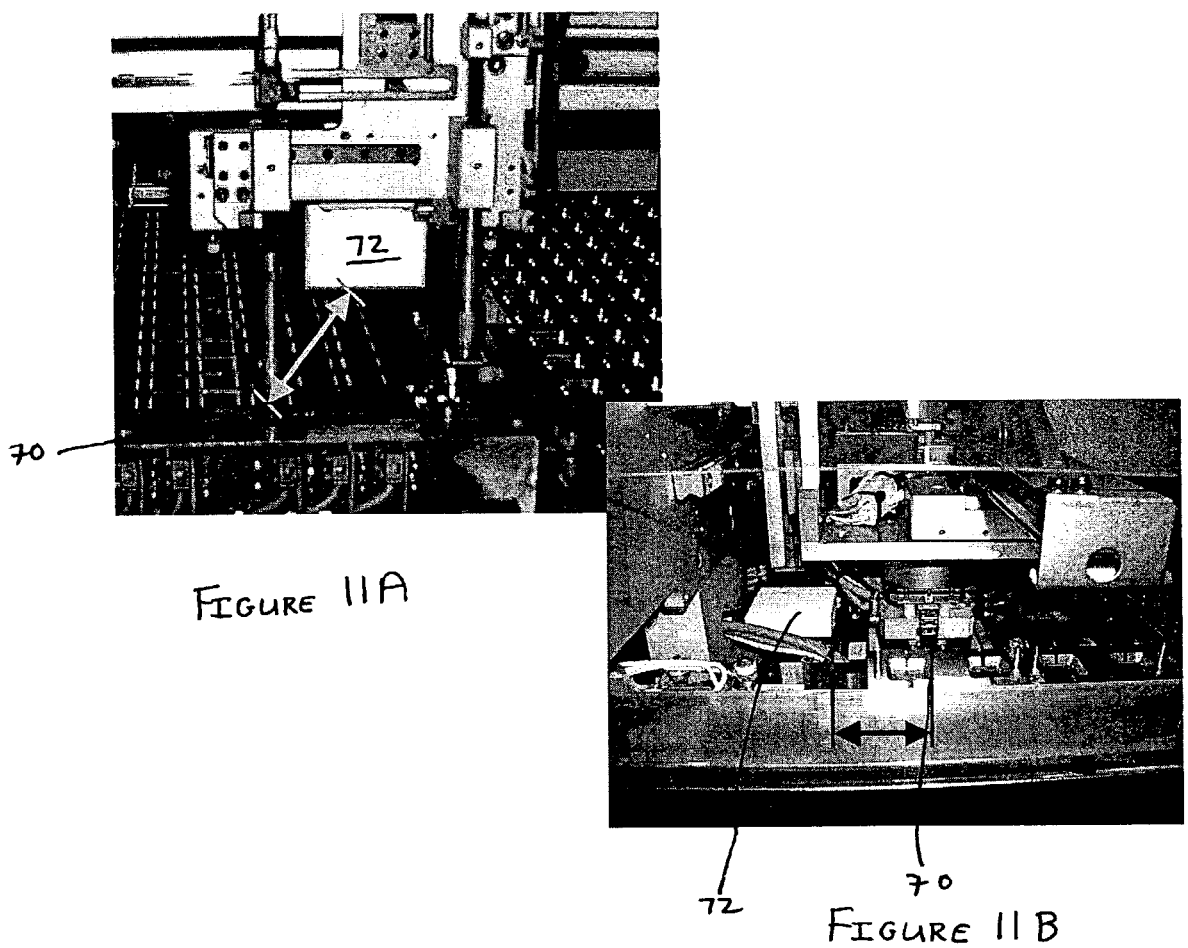

PROCESS PARAMETER EVENT MONITORING SYSTEM AND METHOD FOR PROCESS

BACKGROUND OF THE INVENTION

This invention relates generally to a system and method for measuring process parameters in a process and in particular to a system and method for measuring process parameters in process equipment used during a manufacturing process, including semiconductor manufacturing, disk drive manufacturing, flat panel display manufacturing, medical device manufacturing or electronic component assembly, etc..

One manufacturing area in which process parameters are critical is the semiconductor device manufacturing process. In the semiconductor manufacturing process, one particularly important parameter is the electrostatic discharge (ESD) occurrence parameter (which includes electrostatic discharges or electrostatic voltages). With the advances of semiconductor technology, ESD damage to the semiconductor devices today has become a larger factor in yield losses. There are several objective reasons why ESD damage has become such a large factor in yield losses. The smaller geometries of the semiconductor device structures (such as the gate size or oxide thickness) means higher sensitivity to ESD occurrences (including electrostatic discharge or electrostatic voltage). In particular, it takes much less energy to destroy a trace for a device on a die with a $0.10\mu$ geometry than for a device with an older $0.25\mu$ geometry. Furthermore, conventional well known ESD protection measures that are built into the devices are not fully compatible with high-speed signals. In particular, the relatively high parasitic capacitance of the ESD protection measures substantially affects slew rate and rise and fall time of pulses at high speeds. Smaller-capacitance ESD protective devices might affect high-speed signals to a lesser degree, however they offer much less protection against ESD. Radio frequency (RF)/MMIC integrated circuit devices (ICs) cannot afford to have the level of ESD protection that is common for digital ICs. FIG. 1 shows the changing ESD sensitivity for different semiconductor technologies. As shown, power integrated circuits (ICs) have a much lower level of ESD sensitivity (are able to handle approximately 1000 volts without failing) than high-speed ICs, which in turn have less sensitivity to ESD than RF ICs.

The increased number of I/O pins on modern ICs statistically increases the probability of IC failure. Furthermore, the larger die sizes used today make losses more expensive. In addition, integrated circuits exposed to one or more ESD occurrences (including electrostatic discharge or electrostatic voltage) may not fail right away, but the latent damage causes losses and alienates customers.

Modernly, there is an increasing pressure to reduce the cost of each IC. The handling time for each IC accounts for some portion of the cost of the IC. Therefore, to reduce costs, handling time is reduced which results in the ICs being moved faster through the manufacturing process. The result of the more rapid processing of the IC are that static voltage is accumulated extremely fast. In addition, the conventional ionizers cannot handle such rapid movement since it takes several seconds for an ionizer to discharge IC to a safe voltage level. In these few seconds that it takes the ionizer to properly discharge the unwanted voltage, several ICs will be tested and moved away from the test area. The only feedback as to whether or not the ionizer is operating properly is the yield figure so that the problem cannot be corrected until after a lot of semiconductor devices are lost.

The most damaging discharges often occur after the IC was tested (e.g., when the IC leaves the test socket, when the IC is placed on the exit shuttle and when the IC is placed onto the exit tray). In all these cases, a manufacturer has no knowledge of IC damage and can unknowingly ship defective products to a customer. While it is nearly impossible to completely avoid ESD exposure of sensitive components, it is possible to identify steps in the process that are responsible for ESD damage and to identify and isolate exposed components. Thus, Event monitoring offer various benefits to a semiconductor manufacture. Event monitoring will allow the manufacturer to isolate ESD occurrences, to identify exposed parts and to alert personnel to the ESD problems so that the ESD problems may be corrected. Event monitoring also will provide valuable statistics to the manufacturer, become part of the SPC, identify the most vulnerable steps in the process and ultimately assure that no IC exposed to ESD and damaged by the ESD is shipped to a customer.

The most dominant type of discharge of concern in an IC handler is CDM (Charge Device Model). CDM events are characterized by the following critical parameters including a very short rise time, a very short duration and a very high magnitude. The damage caused to the device by the discharge is a function of the power of the discharge, i.e. the rate of influx of energy into device. Therefore, in order to assess the ESD exposure of a device, it is important to monitor the rise time of the discharge, the duration of the discharge and the magnitude of the discharge and not only the peak magnitude of discharge ESD occurrences (including electrostatic discharge or electrostatic voltage) are detected by measuring electromagnetic radiation produced by the discharge. The specific properties of the emission generated by ESD occurrences (including electrostatic discharge or electrostatic voltage) include very short pulse duration (in the nanosecond range), rapid rise time (under 500 picoseconds for CDM-type discharges) and wide bandwidth. Event Monitors are tuned to these and other unique electromagnetic properties of ESD occurrence and are capable of measuring strength of each individual ESD occurrence and also of resolving multiple ESD occurrences (including electrostatic discharge or electrostatic voltage) that are common in production environment.

It is desirable to have an process parameter event monitoring system and method that is able to monitor the ESD occurrences (including electrostatic discharge or electrostatic voltage) for each machine in the semiconductor process so that ESD occurrences (including electrostatic discharge or electrostatic voltage) are detected quickly and corrected. It also is desirable to provide a system and method that is capable of monitoring other process parameters, such as pressure, temperature, etc. in other processes, including but not limited to disk drive manufacturing, flat panel production, medical device manufacture, electronic assembly, etc. Thus, it is desirable to provide an process parameter event monitoring system and method that measures various process parameters of various different manufacturing processes and it is to this end that the present invention is directed.

SUMMARY OF THE INVENTION

A process parameter event monitoring system and method that measures various different process parameters for a variety of different processes is described. In one embodiment of the invention, an process parameter event monitoring system and method for a semiconductor process tool are provided. The system permits various types of ESD occurrences, including but not limited to electrostatic discharge (ESD) events and static voltages, to be measured which harm a device being processed by the semiconductor process tool. In other embodiments of the invention, the process parameter event monitoring system and method may be used to monitor one or more process parameters, such as pressure, temperature, etc., of various different processes, such as disk drive production processes, flat panel production processes, medical device manufacturing processes, electronic assembly processes, etc.

Thus, in accordance with the invention, an apparatus for monitoring an electrostatic discharge (ESD) occurrence in a semiconductor process tool that affects a device being processed by the semiconductor process tool is provided. The apparatus comprises one or more sensors wherein each sensor is located adjacent to a part of the semiconductor process tool to detect an ESD occurrence near the part of the semiconductor process tool. The apparatus also has a control unit coupled to each sensor wherein the control unit has a processor that receives the signals from each sensor and generates ESD occurrence signals. The apparatus also has a semiconductor tool coupled to the control unit wherein the tool communicates a gating signal to the control unit corresponding to an event of the semiconductor tool which may expose a device to an ESD occurrence so that ESD occurrence signals that do not occur during the gating signal time period are filtered out.

In accordance with another aspect of the invention, a method for monitoring process, parameter events that occur in a process tool that affect a device being processed by the process tool is provided. In the method, a process parameter event near the part of the process tool is detected and the generation of an process parameter event signal is synchronized with the operation of the process tool so that process parameter events that are detected during predetermined periods of time are filtered out and do not generate an process parameter event signal.

In accordance with yet another aspect of the invention, a method for handling integrated circuit devices in a semiconductor process machine is provided. In the method, an electrostatic discharge occurrence is detected that has occurred in the semiconductor process tool near a particular device using a sensor. The method then determines if the electrostatic discharge occurrence is greater than a damage threshold value and automatically placing the particular device into a separate tray if the electrostatic discharge occurrence is greater than the damage threshold value.

In accordance with yet another aspect of the invention, an event monitoring apparatus for a process tool is provided. The apparatus has one or more sensors wherein each sensor is located adjacent to a part of the semiconductor process tool to detect an process parameter event near the part of the process tool. The apparatus also has a control unit coupled to each sensor wherein the control unit has a processor that receives the signals from each sensor and generates an process parameter event signal and wherein the control unit receives a gating signal from the process tool so that an event signal that does not occur during the gating signal is filtered out.

BRIEF DESCRIPTION OF THE DRAWINGS

FIG. 4 is a diagram illustrating an example of the preferred data packet structure for data transfer between the process parameter event monitoring system and the process tool;

FIG. 5 is a diagram illustrating an example of the preferred data packet structure for setting thresholds of the process parameter event monitoring system by the process tool;

FIG. 6 is a diagram illustrating an example of the preferred data packet structure for reading threshold settings from the process parameter event monitoring system by the process tool;

FIGS. 11A and 11B are diagram illustrating examples of the placement of the sensor of the process parameter event monitoring system relative to a particular part of a semiconductor process tool.

DETAILED DESCRIPTION OF A PREFERRED EMBODIMENT

Figure 1:
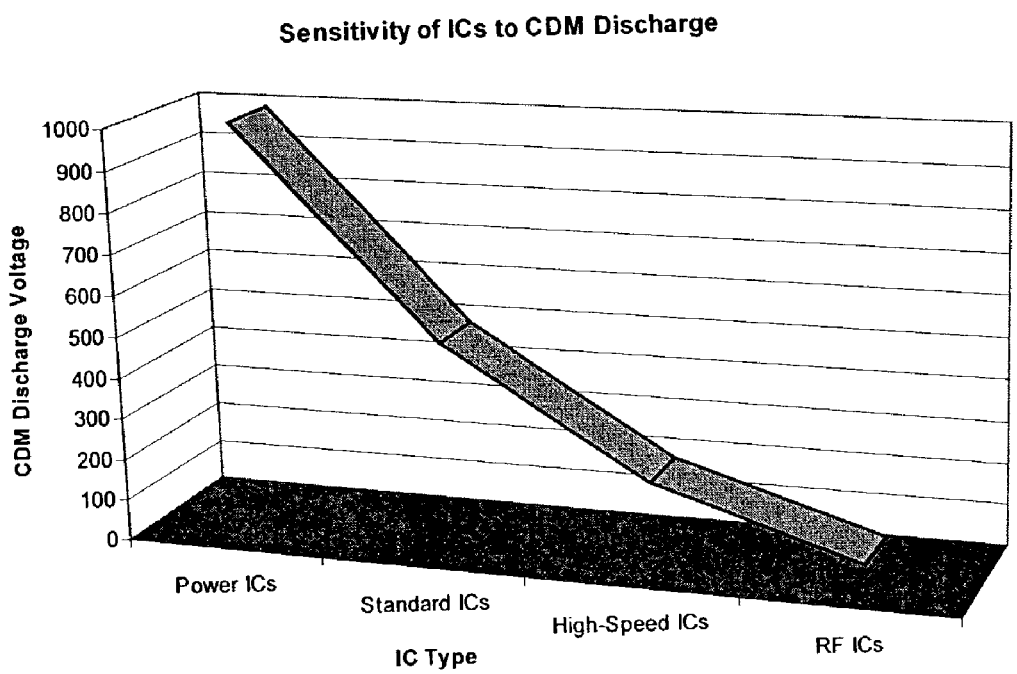
FIG. 1 is a chart illustrating the electrostatic discharge (ESD) sensitivity for different semiconductor devices.

The invention is particularly applicable to a process parameter event monitoring system for use with an integrated circuit (IC) handler process tool and it is in this context that the invention will be described. It will be appreciated, however, that the system and method in accordance with the invention has greater utility since the process parameter event monitoring system and method may be integrated with/ used with a variety of different semiconductor process tools. For example, the process parameter event monitoring system may be integrated into a die attach tool, a pick-and-place machine or photolithography tools (steppers, etc . . . ) to name a few. The process parameter event monitoring system may also be used to monitor other process parameters associated with a semiconductor process tool, such as pressure changes or temperature changes that occur in the semiconductor process tools. The system and method in accordance with the invention may also be used to measure process parameters for other manufacturing processes including disk drive manufacturing, flat panel display manufacturing, medical device manufacturing or electronic component assembly, etc..

In one embodiment, the process parameter event monitoring system may be used with any semiconductor process tool in which ESD occurrences may occur and it is desirable to determine the source, strength and frequency of those ESD occurrences (including electrostatic discharge or electrostatic voltage) in order to increase the yield of the semiconductor process. For example, with a die-attach tool, ESD occurrences (including electrostatic discharge or electrostatic voltage) may occur when the die picker contacts the die in a tape package prior to moving the die to bonding. The situation is aggravated by the fact that the die will become charged when it is separated from the tape. In addition, the combination of the rapid movement of the robotic arm of the die attach mechanism and insufficient ionization results in occasional discharges to the frame when the die is placed on the frame even through the bottom of the die is an insulator. For the die attach tool, an ESD sensor may be placed on the moving arm next to the vacuum picker to provide instant information that an ESD discharge occurs when the die is touched or when the die is placed into a frame. Then, if an ESD occurrence has occurred, the die exposed to the ESD discharge may be isolated in a separate tray. The process parameter event monitoring system may be synchronized to the die attach tool using a vacuum relay signal (similar to the integrated circuit handler described in more detail below).

For a typical pick-and-place machine, a vacuum picker lift an integrated circuit (IC) from a tray or reel and placed the IC on to a circuit board. When the IC is lifted, electrostatic charge is often accumulated. Then, when the IC is placed onto the metal pads of the circuit board, a discharge is likely to occur. The placement of an ESD sensor on the moving arm of the pick-and-place machine would permit the tool to determine when an IC has been exposed to an ESD event so that the tool may place the exposed IC into a different tray and then use an unexposed IC for placement into the circuit board. Thus, the pick-and-place machine is less likely to place a damaged IC into a circuit board. The Event monitor may be synchronized to the pick-and-place machine using a vacuum relay signal (similar to the integrated circuit handler described in more detail below).

For a photolithography machine, reticle ESD damage causes substantial losses. With shrinking device geometries, the damage due to ESD discharges in more frequent. In particular, ESD damage may occur to a reticle when the reticle is exposed to large changing electrostatic fields. In accordance with the invention, a sensor that detects both electrostatic field and ESD occurrences (including electrostatic discharge or electrostatic voltage) may be placed inside of the photolithography tool so that the discharges and the electrostatic field may be measured to identify potentially harmful electrostatic or ESD occurrences (including electrostatic discharge or electrostatic voltage). Once a potentially harmful ESD occurrence is identified, the reticle may be inspected prior to further processing.

The integration of process parameter event sensors (in an process parameter event monitoring system) into various different semiconductor process tools offers may advantages. The detection and response to an ESD event occur automatically since the process parameter event monitoring system is integrated tightly with the particular tool. The process parameter event monitoring system also permits the automatic disposition of exposed parts. The process parameter event monitoring system also provides advanced filtering of irrelevant ESD occurrences (including electrostatic discharge or electrostatic voltage) and the collection of valuable statistics on ESD environment for failure analysis and as evidence of compliance with customer's ESD requirements.

There are several challenges in monitoring ESD occurrences (including electrostatic discharge or electrostatic voltage) inside the tools in accordance with the invention. These challenges include background EMI "noise" in the tool, variations in distance of the sensor antenna to the IC and disposition of exposed ICs. Typical tool, such as IC handler, has many moving metal parts that may produce a discharge during contact. Whether or not such events may or may not cause harm to the ICs, they do register on the Event Monitor making localization of ESD occurrences (including electrostatic discharge or electrostatic voltage) challenging. Sometimes very strong ESD occurrences (including electrostatic discharge or electrostatic voltage) from other tools can propagate throughout the facility and produce readings that have nothing to do with the particular IC. These are legitimate ESD occurrences (including electrostatic discharge or electrostatic voltage) that are an indication that the tool has ESD problems that need to be addressed. Another type of ambient EMI noise is the one generated by operation of equipment. As an example, contacts of a relay may produce spark when commutating high voltage. Such spark would produce the same emission as an ESD Event and will be detected by Event Monitor. Strong EMI in the IC handler may also interfere with testing of high-speed ICs and cause errors in testing. These challenges involving EMI noise are overcome by the process parameter event monitoring system as described below.

In a typical manual operation, if an IC experienced a discharge and a stand-alone Event monitor properly registered it, an operator can manually place exposed IC in a separate tray. In an IC handler with ICs being processed at a high speed it is impossible, if not impractical, to expect human intervention every time the discharge has occurred. Therefore, a tool must be able to carry out certain actions based on the information provided by Event monitor. The process parameter event monitoring system in accordance with the invention overcomes this problem. Now, an example of a process tool (an integrated circuit handler in this example) with an integrated process parameter event monitor in accordance with the invention will be described.

Figure 2:
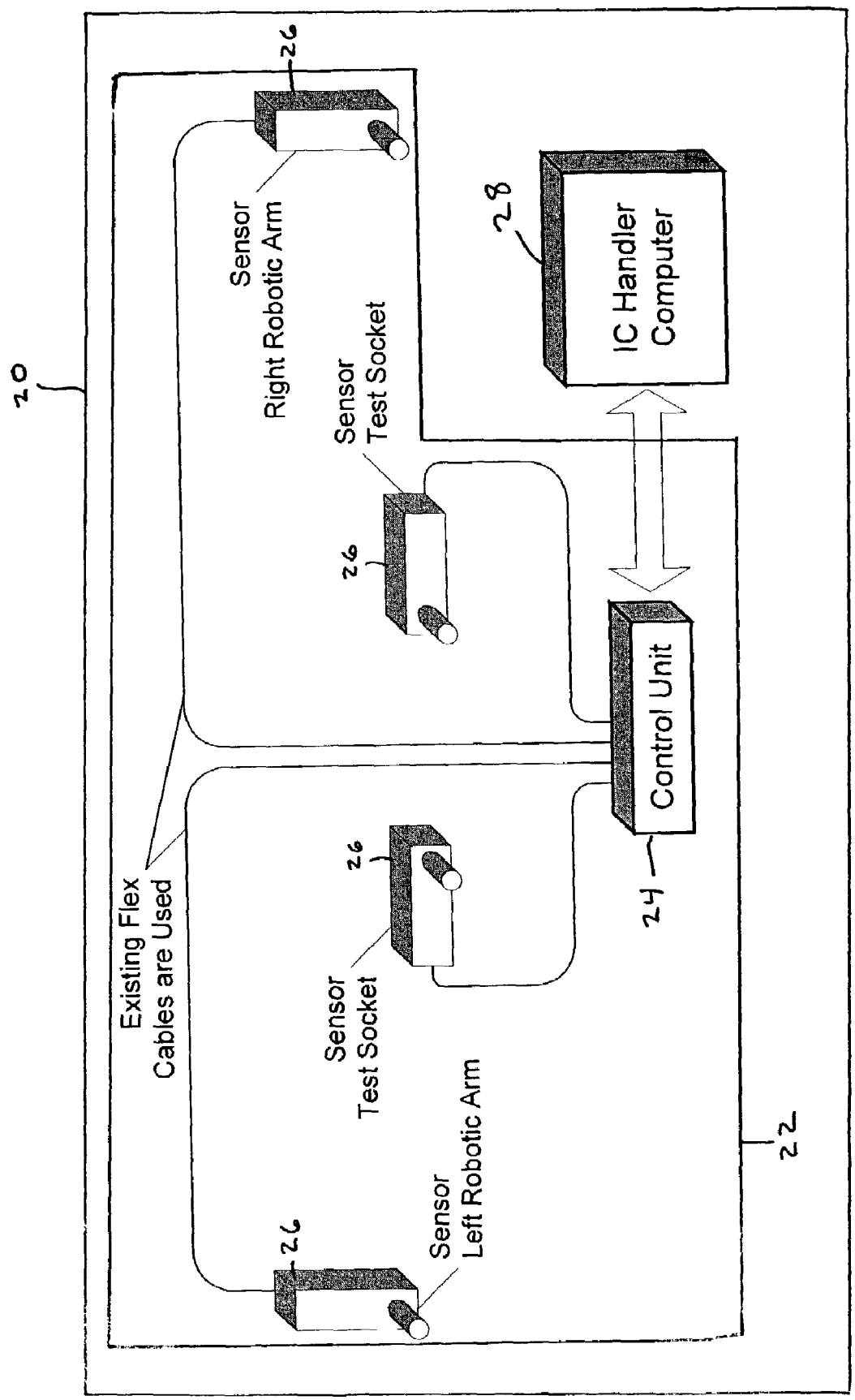
FIG. 2 is an example of a process tool, such as a Integrated Circuit Handler, which incorporates the process parameter monitoring system in accordance with the invention.

FIG. 2 is an example of a process tool 20, such as a Integrated Circuit Handler, which incorporates a process parameter event monitoring system 22 in accordance with the invention. In this diagram, the various elements of the process tool 20 are not shown since those elements are well understood. Generally, the process parameter event monitoring system 22 comprises a control unit 24 (with computing resources) and one or more remote sensors 26 that are placed near one or more points of interest in the process tool where process parameter events may occur. In the example shown in FIG. 2, the process parameter event monitoring system may detect ESD occurrences (ESD discharges or electrostatic voltages) that occur in the semiconductor process tool. In this example with the IC handler, the sensors are placed near a left robotic arm, near a first test socket, near a second test socket and near a right robotic arm. The invention is not limited to any particular number of sensors. The sensors are not described further herein as various different sensors may be used with the invention. Examples of preferred ESD occurrence sensors that may be used with the invention are described in co-pending U.S. patent application Ser. No. 09/551,412 filed on Apr. 18, 2000 and entitled "Electrostatic Discharge and Transient Signals Monitoring System and Method" and co-pending U.S. patent application Ser. No. 09/876,200 filed on Jun. 6, 2001 and entitled "Apparatus and Method for Detection and Measurement of Environmental Parameters". These applications are both owned by the same assignee as the present application and are incorporated herein by reference. Examples of other sensors for detecting other process parameters, such as pressure or temperature sensors, are well known and will not be described herein.

As shown in FIG. 2, the control unit 24 of the process parameter event monitoring system is connected to the tool's computer 28. For example, the control unit 24 may be connected to the tool's computer 28 by a well known RS232 interface or any other interface. The interconnection of the process parameter event monitoring system with the computer 28 of the tool permits the process parameter event monitoring system to communicate data with the process tool of the process tool's computer, permits the tool or the tool's computer to configure the process parameter event monitoring system and permits the automatic detection and handling of process parameter events (such as ESD occurrences (including electrostatic discharge or electrostatic voltage) in this example). Due to the construction of the sensors, no special cables are necessary to connect them to the control unit. For example, sensors placed on moving robotic arms utilize existing wiring already present in the wire harness of the arms as shown in FIG. 2. In particular, because ESD occurrences generate electromagnetic signals in a very broad range, especially at high frequencies, a special coaxial signal is needed to pass the signal from the antenna to the monitor. In the case of this invention, the sensor incorporates antenna and processing means (i.e. A/D converter, microprocessor, etc. or simply a circuit that converts high-frequency signal into a lower-frequency data). The signal from that sensor is now capable of being communicated to the control unit via regular data wires without need of special coaxial cable because there is no RF signal present on these wires. The same cable between the control unit and the sensor supplies power to the sensor.

Figure 3:
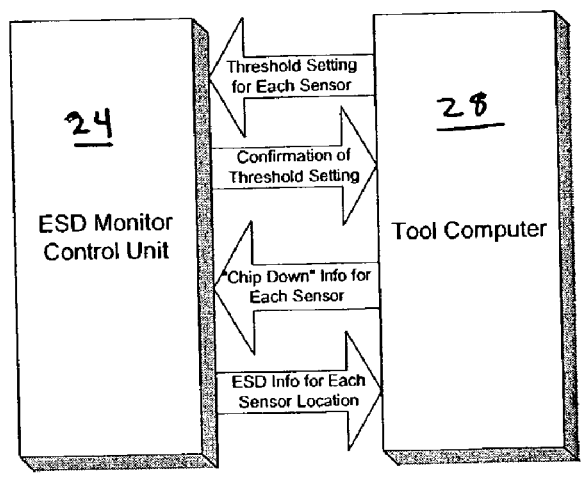
FIG. 3 is a diagram illustrating an example of a preferred interface between the process parameter event monitoring control unit and the computer of the process tool.

FIG. 3 is a diagram illustrating an example of a preferred interface between the Event monitor control unit 24 and the computer 28 of the process tool. As shown, various data is passed between the ESD control unit 24 and the computer 28. For example, the computer 28 configures each sensor, such as sending threshold settings for each sensor to the Event monitor control unit 24. The computer 28 may also generate "chip down" information for each sensor that is sent to the Event monitor control unit 24 so that each sensor is able to gate the process parameter events (such as ESD occurrences (including electrostatic discharge or electrostatic voltage) in this example) and eliminate spurious process parameter events. The process parameter event monitoring control unit 24 may gather and send process parameter event information for each sensor at each sensor location to the computer 28. The process parameter event monitoring control unit 24 also may send confirmation of threshold settings of each sensor. Now, an example of an implementation of the process parameter event monitoring system in accordance with the invention in a semiconductor process tool wherein ESD occurrences are detected will be described.

The system is intended for monitoring ESD occurrences (including electrostatic discharge or electrostatic voltage) inside a semiconductor manufacturing tool such as a test handler or a wafer handler. The system consists of up to eight remote sensors (in this example of one implementation of the system) that can be placed very near the points where ESD occurrences (including electrostatic discharge or electrostatic voltage) are generated. The control unit 24 that obtains event data from the remote sensors and presents processed data to a host device, such as the computer 28 of the tool, in which the process parameter event monitoring system is integrated. The host device may be the computer controlling the handler or a display module that provides a user interface and a means of presenting the event data. Additional sensors may be included that measure other functions such as static voltage or ionizer induced charge decay. To reduce the collected data to only relevant events, the system will take up to eight trigger signals from the handler, and use these to generate time gates for reporting data as described in more detail below. Data is read from the remote sensors and stored in memory every millisecond. The remote sensors may be sampling data at a faster rate but will only report the highest value for the millisecond time window.

Each remote sensor has an antennae that receives the analog ESD event signals. Each remote sensor also has a control portion that comprises a PIC16F627 processor and an A/D converter. The processor contains 128 bytes of EEPROM that is used for storing serial number, identification code, and calibration data. The USART port is used in a slave mode for all communication, and calibration. All processors need to be programmed with a their specific operating system prior to assembly. The serial interface in the processor is operated in an interrupt mode. In particular, the remote continuously takes its readings and interacts with the control unit only when interrupted. All read routines need to be interrupt proof. The latency time between the reception of a command byte and loading data into the transmit buffer cannot exceed 16–20 microseconds or 14–18 instructions. The time between transmission bytes is limited to 9 instructions. Special serial command codes are provided that allow for programming of the serial number, device identification, and calibration. Serial communication to and from the remote sensor is timed out by the remote's watch dog timer. To initialize and synchronize the remote sensors, the control unit must send a command code then wait 25 milliseconds. This will reset all remotes and establish the next byte sent as a command.

The communication between the remote sensors and the control unit takes place over a two-line interface to each of the remote sensors. One line is a clock and is always driven from the control unit. The other line is a bi-directional data line. Data is clocked out LSB first with the data changing on the rising edge of the clock and read on the falling edge. All transactions start with the control unit sending a control byte followed by the remote sending or receiving four bytes of packed data. The type of data sent is a function of the command sent to the remote sensors. The commands are as follows:

| CODE | FUNCTION | REMOTE RESPONSE |
| --- | --- | --- |
| 41 h | identify | identification byte and serial number |
| 42 h | send data | measured data, up to 3 data points |
| 50 h | no operation | does nothing |
| 51 h | set identify | save identify data |
| 52 h | set cal data 1 | save cal data 1 |
| 53 h | set cal data 2 | save cal data 2 |
| 54 h | set cal data 3 | save cal data 3 |
| 55 h | set cal data 4 | save cal data 4 |
| 56 h | reset cal | set default calibration |

All data is moved from all remote sensors together and may contain up to three 10-bit data points. If a remote sensor is sending only one type of data, the first most significant two data fields are zeros and the data is right justified in the last two bytes sent (least significant data field). The most significant bits of the first byte data string are always zero. The least significant byte is sent first and the least significant bit is out first. All codes in the range of 40 h to 4 Fh are asking for data from the sensor. Codes in the range of 50 h to 5 Fh require the remote sensor to accept data. Data is sent to all remote sensors and consists of four bytes.

If the data is intended for only one remote sensor, that remote sensor will receive the desired command and all others will be sent a 'no operation' command. There is to be a 16–20 microsecond wait between sending the command byte and starting to send or receive the first data byte. There will be a 10 microsecond wait between each of the data bytes. The total data transfer time is 180–192 microseconds to get data from the remotes. Sending data to the remote sensors takes an unspecified time but must be less than 19 milliseconds. Now, the control unit will be described in more detail.

The central hardware (the control unit 24 shown in FIG. 2) may comprise a PIC18C601 ROMless processor connected to 64K words of flash program memory and 32K words of static RAM. In addition, there will be the input logic required to accept twelve trigger inputs and communication logic for eight remote sensors. A single RS-232 serial port will be provided that will operate at 19,200 baud full duplex and communicate with the host system. Dual color indicator lamps will be provided to indicate proper operation and the detection status of each remote sensor. The indication will be green for the remote sensor connected and operating, off for no remote sensor, and orange for detection of data outside of the specified range. The lamp will stay orange until the data has been communicated with the host. There will be an additional red indicator lamp for power on and one dual color lamp to indicate data transactions with the host. The lamp will be green when idle, yellow when receiving data, and red when sending data. The indicators, the RS-232 connector, and the power connector will all be arranged on the front panel of the central control unit. All connections to the remote sensors and the barrier strip for trigger connections will all be on the rear.

Within the memory described above, there are sixteen data storage channels, each capable of storing 2048 sample bins. Each bin represents the worst-case measurement taken during a one-millisecond sample interval. Each data channel is allocated to a sensor data source. All data from the source is recorded without regard to any specified thresholds or limits. Any channel can only record one type of data. If a sensor is capable of measuring more than one stimulus, each different type of measurement must be allocated to a different data storage channel.

There are twelve external triggers provided. These are external time reference signals that are used by the reporting channels to establish time windows for reporting data to the host. These channels are optically isolated and require a minimum drive level of 4–5 milliamps and a maximum of 25 milliamps. The equivalent input is 1270 ohms in series with a 1.2 volt diode. The LED is bi-directional. These signals may be positive or negative true and may be 0 to 5 volt up to 0 to 24 volt signals. They are digitally filtered to eliminate noise.

A data reporting channel ties the recorded data to the trigger, calculates a time window, checks the data against threshold limits and sends the data to the host. The reporting channels are a software construct that allows for data manipulation, consolidation, and reporting. Sixteen reporting channels are provided for in the software. Each data reporting channel can have associated with it a suppression channel. This allows for suppressing the reporting of data in the specified recording channel if coincident data occurs on the suppression channel that exceeds a specified threshold. This can be used to eliminate high magnitude events that are detected on multiple sensors. A single, above threshold, event on the suppression channel will suppress data in the coincident time bin and the bins directly before and after the bin in which the event was detected.

All data transfers to the tool's computer 28 (the host) are a 4-byte record terminated by a carriage return. The first byte is the address code as ASCII hex 0 to F corresponding to reporting channels 1 through 16. The next three bytes are the data being reported. The data range is 000 to 999. All data is human readable and is sent as available. This requires five bytes for each data point transfer or 2.6 milliseconds. Each data point is queued in a software FIFO. If all 16 reporting channels are reporting data at the same time, there can be a 40 millisecond delay between an event and the reporting of the final detection of that event.

Either the host (the tool's computer 28) or the factory needs to provide the setup information to the control unit for each of the available recording channels. The setup data is sent to the control unit over the RS-232 port as a single record for each channel. Each record is terminated by a carriage return and a comma delimits each field in the record. The fields are as follows:

| Field number | Function | Range |
|---|---|---|
| 0 | identification | S for recording channel setup |
| 1 | recording channel | 01 to 16 |
| 2 | remote number | 1 to 8 |
| 3 | remote data number* | 1 to 3 |

*As remotes may, in the future, have more than one function, this field is included to specify which of the remote functions is to be recorded. The setup data should be stored by the central in non-volatile RAM so that it need be sent only once. This can be done at the factory to ease setup requirements in the field.

The reporting channel setup includes the assigning of recording channels, the specification of threshold values, the specification of trigger channels, trigger direction, gate pre- and post- recording times, and the specification of suppression channels. There are both a high and low threshold value specified. If the recorded data is between the high and low threshold, the data is not reported. The specification of the trigger channel number allows for selecting a time reference to periodically report data from a recording channel. This will allow for periodic reporting of measurements such as temperature, humidity, and CPM decay. The full format of the setup communications are as follows:

| Field | Function | Range |
|---|---|---|
| 0 | identification | R for reporting channel setup |
| 1 | reporting channel | 01 to 16 |
| 2 | recording channel | 01 to 16 |
| 3 | trigger channel number | 01 to 30* |
| 4 | pre-trigger recording time | 000 to 500 |
| 5 | post-trigger recording time | 000 to 500 |
| 6 | suppression recording channel | 00 to 16 (00 = no suppression) |
| 0 | identification | T for reporting channel thresholds |
| 1 | reporting channel | 01 to 16 |
| 2 | high threshold | 000 to 999 |
| 3 | low threshold | 000 to 999 |

-continued

| Field | Function | Range |
|---|---|---|
| 4 | suppression high threshold | 000 to 999 |
| 5 | suppression low threshold | 000 to 999 |

*Trigger channel numbers 1 to 12 specify rising edge of channels 1 to 12. Trigger channel numbers 13 to 24 specify falling edge of channels 1 to 12. Channel numbers 25 to 30 specify fixed time intervals of .5, 1.0, 5.0, 10, 60, and 300 seconds. After all setup data is sent to the central, the setup data must be saved in the flash memory. This is accomplished by sending the save command: X<CR>.

Other data transfers are possible between the host and central unit. These include the host requesting the channel setup data, the sensor identification codes and serial numbers, and the set thresholds. All data transfers of this type are initiated by the host and are single character commands or a command followed by a channel number.

I<CR> Identify all sensors. When the central (control unit 24) receives this command, it responds with the sensor number, ID code, and serial number for all eight remotes. If a remote channel is left unused, the code and serial number are reported as zeros. This command also causes the central to reset all remote sensors.

| Field | Function | Range |
|---|---|---|
| 0 | identification | I for reporting channel identification |
| 1 | remote number | 01 to 08 |
| 2 | sensor ID | 000 to 255 |
| 3 | sensor serial number | 0000000 to 9999999 |

J(nn)<CR> Report setup of recording channel nn. When the central receives this command, it responds with the setup of the specified recording channel. This data is reported in the same format as received from the host. See field specifications for recording channel setup.

K(nn)<CR> Report setup of reporting channel nn. When the central receives this command, it responds with the setup of the specified reporting channel. This data is reported in the same format as received from the host. See field specifications for reporting channel setup.

L(nn)<CR> Report thresholds of reporting channel nn. When the central receives this command, it responds with the threshold data for the specified reporting channel. This data is reported in the same format as received from the host. See field specifications for reporting channel setup.

Z<CR> Reset central, all remotes, and reload setup information from the flash memory.

The remote sensor display host will contain a single display module with the capability of switching the display to any selected reporting channel. It also needs a visual indication of which channels have event or failure data. There also needs to be a means of setting each channel's threshold. Some type of data logging also needs to be provided along with a clock for time stamping of logged data. This host will be limited in that it will not be able to set up the data recording channels or perform any of the additional central-host communication functions. Now, the set-up procedure will be described in more detail.

A typical installation on a handler may consist of five ESD sensors situated as follows:

1. One sensor on the input arm located between the two pickups.
2. One sensor on the output arm located between the two pickups.
3. Two sensors located by each of the test sockets.
4. One sensor located on the top outside of the tool.

On the input and output arms are each two vacuum pickups. There are two test arms transferring devices to and from the test sockets and shuttles. Each test arm has two vacuum pickups. This makes eight vacuum pickups total, each of which is operating independently.

With only five sensors each with only one type of data, only five recording channels are required. To assign sensors 1 through 5 to recording channels 1 through 5, the following commands would be sent to the central.
S,01,1,1<CR>
S,02,2,1<CR>
S,03,3,1<CR>
S,04,4,1<CR>
S,05,5,1<CR>

The field definition and data ranges for this portion of the setup are:

| Field number | Function | Range |
|---|---|---|
| 0 | identification | S for recording channel setup |
| 1 | recording channel | 01 to 16 |
| 2 | remote number | 1 to 8 |
| 3 | remote data number* | 1 to 3 |

*As remotes may, in the future, have more than one function, this field is included to specify which of the remote functions is to be recorded.

This installation has eight vacuum pickups and significant events can occur during pickup (vacuum on) and drop off (vacuum off). Accordingly, there are 16 different time windows when events can occur. Each separate time window requires its own reporting channel and the reporting channel ties together a trigger edge, a time window around the trigger edge, a sensor, the data reporting threshold and data suppression. The fifth sensor located outside the tool will detect large external ESD occurrences (including electrostatic discharge or electrostatic voltage). If one of these events occurs during the time window for a sensor inside the tool, the data will be reported even though it is not a valid event. Using the data from the outside sensor as a reference, outside events can be removed from the reported events. The drive to each of the eight vacuum pickup valves is used as the trigger inputs to the central. They could be allocated trigger channel numbers as follows:

The two pickups on the input arm are designated triggers 1 and 2.

The two pickups on the input test arm are designated triggers 3 and 4.

The two pickups on the output test arm are designated triggers 5 and 6.

The two pickups on the output arm are designated triggers 7 and 8.

Reporting channels 1 through 8 are the pickup for triggers 1 through 8 and channels 9 through 16 are the drop off for channels 1 through 8. The setup commands for reporting channels 1, 2, 9, and 10 would be as follows:
R,01,01,01,100,100,05<CR>
R,02,01,02,100,100,05<CR>
R,09,01,13,100,100,05<CR>
R,10,01,14,100,100,05<CR>

Since both pickups on the input arm are associated with sensor 1, all four channels specify recording channel 1. In this example all data detected within a 200 millisecond window centered on the trigger edge will be reported. Recording channel 5 is specified for use in data suppression. The remaining twelve reporting channels are specified is a similar manner. The field definition and data ranges are:

| Field | Function | Range |
|---|---|---|
| 0 | identification | R for reporting channel setup |
| 1 | reporting channel | 01 to 16 |
| 2 | recording channel | 01 to 16 |
| 3 | trigger channel number | 01 to 30* |
| 4 | pre-trigger recording time | 000 to 500 in milliseconds |
| 5 | post-trigger recording time | 000 to 500 in milliseconds |
| 6 | suppression recording channel | 00 to 16 (00 = no suppression) |

*Trigger channel numbers 1 to 12 specify rising edge of channels 1 to 12. Trigger channel numbers 13 to 24 specify falling edge of channels 1 to 12. Channel numbers 25 to 30 specify fixed time intervals of .5, 1.0, 5.0, 10, 60, and 300 seconds.

Once the set-up is completed, the set-up data is saved using the same command: X<CR>

The recording and reporting channel setups are only done once as they are stored in the central. This configures the unit for a specific installation and need not be changed unless the installation changes. Although this information can be sent and read back by the installation host, normally the host would only deal with event data and data thresholds. Now, the operation of the Event monitor system during the normal operation of the system will be described.

When the tool is powered on, it may be desirable to read the serial numbers of all of the sensors. This allows for verification that all sensors are connected and operating properly. This would be done as follows:

Host sends the reset command:

Z<CR>

The host then waits 1 second.

Host sends identify command:

I<CR>

The central responds with the I.D.s and serial numbers for each of the eight possible remotes:

| | |
|---|---|
| I,01,010,0000001<CR> | Sensor 1 is of type 010 with serial number 0000001. |
| I,02,010,0000002<CR> | Sensor 2 is of type 010 with serial number 0000002. |
| I,03,010,0000004<CR> | Sensor 3 is of type 010 with serial number 0000004. |
| I,04,010,0000003<CR> | Sensor 4 is of type 010 with serial number 0000003. |
| I,05,010,0000005<CR> | Sensor 5 is of type 010 with serial number 0000005. |
| I,06,000,0000000<CR> | Sensor 6 is not used. |
| I,07,000,0000000<CR> | Sensor 7 is not used. |
| I,08,000,0000000<CR> | Sensor 8 is not used. |

This shows that all five sensors in our typical installation are functioning and communicating properly with the central unit. If a unit is disconnected or not communicating, it would show up as unused. The field definitions and data ranges are:

| Field | Function | Range |
|---|---|---|
| 0 | identification | I for reporting channel identification |
| 1 | remote number | 01 to 08 |

-continued

| Field | Function | Range |
|---|---|---|
| 2 | sensor ID | 000 to 255 |
| 3 | sensor serial number | 0000000 to 9999999 |

After it has been determined that all sensors are connected and communicating, it may be desirable to set the data reporting thresholds. Both high and low thresholds are set for each reporting channel. The data reported will be greater than the low threshold and less than the high threshold. A typical threshold setting command would be:

T,01,999,100,999,250<CR>

This specifies that all data from 100 through 999 will be reported unless the event occurs when an event in the range of 250 to 999 is detected on the suppression channel. The field definitions and data ranges are:

| Field | Function | Range |
|---|---|---|
| 0 | identification | T for reporting channel thresholds |
| 1 | reporting channel | 01 to 16 |
| 2 | high threshold | 000 to 999 |
| 3 | low threshold | 000 to 999 |
| 4 | suppression high threshold | 000 to 999 |
| 5 | suppression low threshold | 000 to 999 |

This procedure would be repeated for each of the active reporting channels. The threshold values are in the units of the associated sensor and related to the sensors full scale output. Once the thresholds have been programmed, they may be saved using the save command: X<CR>

When the tool is operating, recorded data within the threshold and suppression limits will be asynchronously sent to the host. The data sent is the highest event that occurred in the time window for each of the reporting channels. If no data was detected that was within the threshold and suppression limits, no data is sent. The data is in the following format:

| | |
|---|---|
| 5750<CR> | Reporting channel 6 detected a high reading of 750. |
| F431<CR> | Reporting channel 16 detected a high reading of 431. |

The first character specifies the reporting channel number as hex 0 to F corresponding to channels 1 through 16. The next three characters are the recorded data. If an event occurs on every channel at the same time, reporting channel 1 data will be sent first, then reporting channel 2, etc. It takes 2.6 milliseconds to send each data record resulting in a maximum delay from closing of a data window to sending of the data of 42 milliseconds. During this time, another trigger will not be accepted. Now, examples of the preferred data packet structures for the data communications between the process parameter event monitoring control unit and the tool or the tool's computer will be described.

FIG. 4 is a diagram illustrating an example of the preferred data packet structure for data transfer between the process parameter event monitoring system and a process tool, FIG. 5 is a diagram illustrating an example of the preferred data packet structure for setting thresholds of the process parameter event monitoring system by the process tool, and FIG. 6 is a diagram illustrating an example of the preferred data packet structure for reading threshold settings from the process parameter event monitoring system by the process tool. As shown in FIG. 4, the signaling may include TTL pulses and data communications. In more detail, when a process parameter event occurs, the process parameter event monitoring system will send TTL—level pulse (logic level "1") to the tool's computer 28. At the end of this pulse, as shown in FIG. 4, the process parameter event monitoring system will send to the process tool all information about process parameter events that just occurred from all sensors. The process parameter event monitoring system will be sending data until all buffers are emptied. The TTL communication from the process parameter event monitoring system to the process tool is common for all process parameter events and it requires one signal line. Each data packet from the process parameter event monitoring system to the process tool has the following format:

data is in a 6 byte record
  first byte is sensor address as ASCII A through H
  second byte is mode of operation—either setting the threshold (ASCII "T") or transmitting discharge data (ASCII "Z")
  next 3 bytes are the recorded data in decimal format.
  last byte is the record terminator <CR>
  If there were more than one discharge, another packet will follow with the data for the next discharge with TTL signal preceding it as shown in FIG. 4.

Data will be sent at 9600 baud with 2 stop bits. There will be no RS-232 handshake. With 8 sensors and a 10 msec gate, there could be 256 records. The host must have a 1280 character buffer to accept all of the data from all the sensors.

Threshold setting will be done for each sensor individually via RS232 port. Once the process parameter event monitoring system receives data for each individual sensor, it will repeat the data to the process tool as shown in FIG. 5. If the threshold for a particular sensor is not set, it will default to locally-set threshold. It is recommended that all thresholds are to be set in the beginning of the test as a part of the program.

To read thresholds of all of the sensors, the process tool may issue the command string with ASCII "R" as a mode byte. The process parameter event monitoring system will respond with string of data for each individual sensor as shown in FIG. 6. If not all 8 sensors are installed, the process parameter event monitoring system will report zero setting for threshold for each absent sensor. During setting and reading of thresholds do data collection is possible. Now, the gating of the process parameter event monitoring system in accordance with the invention will be described.

Figure 7:
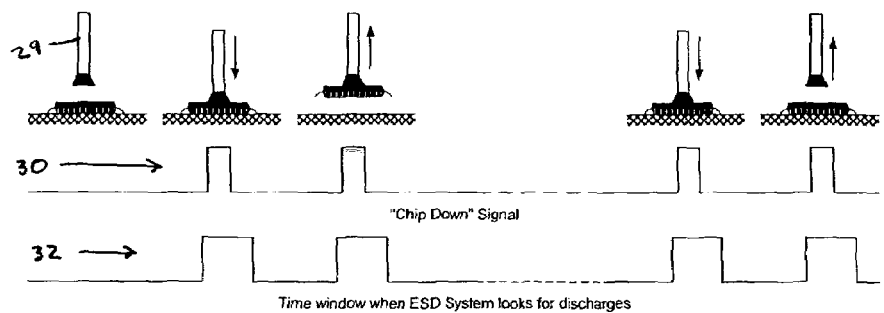
FIG. 7 is a diagram illustrating the gating of the process parameter event monitoring system in accordance with the invention based on the semiconductor process tool operation.

FIG. 7 is a diagram illustrating the gating of the process parameter event monitoring system in accordance with the invention based on a semiconductor process tool operation. In particular, each individual sensor will be enabled (gated) during the times when a process parameter event, such as an ESD discharge, is likely to happen, specifically when IC is either picked up or released. Thus, as shown in FIG. 7, when the IC handler 29 is picking up or placing a chip, the tool will generate a chip down signal 30 which may be generated based on the vacuum relay signal for the tool. From the chip down signal, the process parameter event monitoring system will generate a time window 32 during which the process parameter event monitoring system will record the process parameter events (ESD occurrences including electrostatic discharge or electrostatic voltage) in one example). In this manner, each sensor will report only those ESD occurrences (including electrostatic discharge or electrostatic voltage) that are relevant to a particular operation. For example, a handler will provide the process parameter event monitoring system with TTL-level signal 36 on IC pick up and release for each individual sensor location. The duration of this TTL pulse is typically 10 mS. Since ESD occurrences (including electrostatic discharge or electrostatic voltage) can happen not only when IC is placed on a conductive surface, but also when it is being lifted, the "Chip Down" pulse 30 needs to be issued on IC pickup as well as on IC release.

The process parameter event monitoring system may extend the time that it looks for TTL trigger signal for more than 10 mS because of the time lapse between issuing this signal and the time when the IC actually touches the conductive surface. This time largely depends on the construction of the handler. Therefore, the process parameter event monitoring system may incorporate a data buffer that will be capable of "looking back" for predetermined limited period of time making sure that discharges that happen immediately prior to the action will not be "lost." Thus, as shown in FIG. 7, the time window 32 may start prior to the chip down signal. In a preferred embodiment, the gating signal is provided to each sensor individually on individual signal lines. Now, the preferred ESD event gating method in accordance with the invention will be described in more detail.

Figure 8:
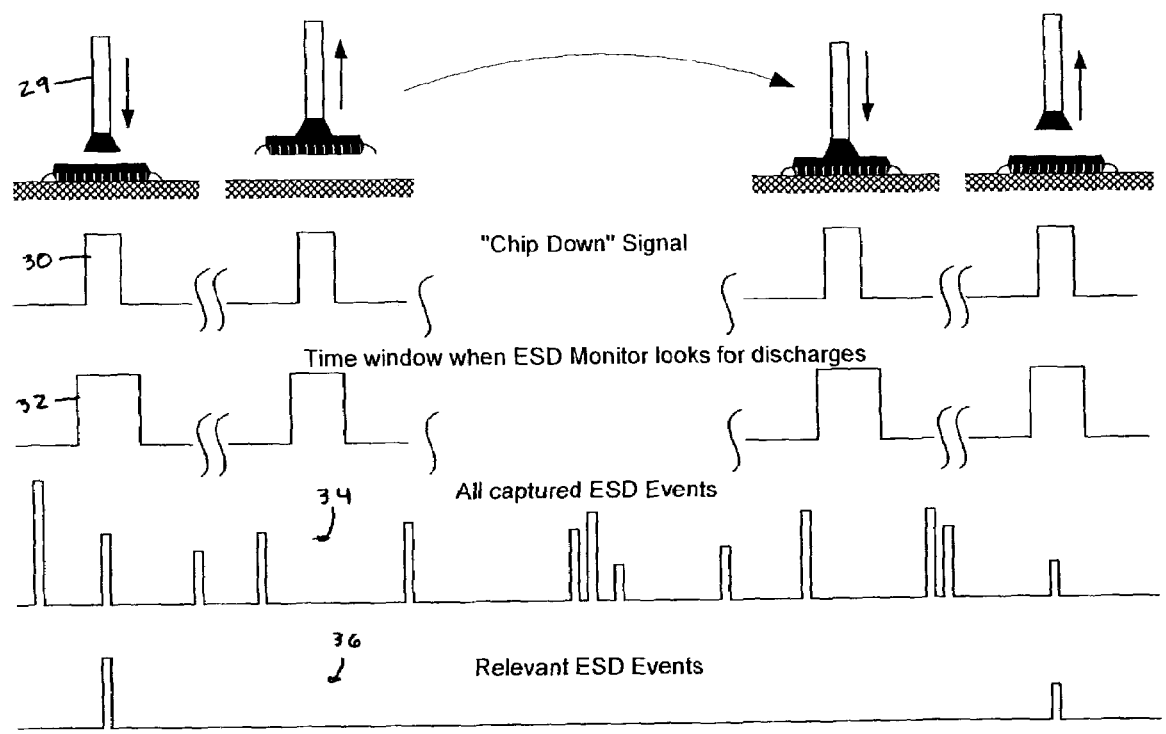
FIG. 8 illustrates more details of the process parameter event monitoring method that includes the gating process shown in FIG. 7.
Figure 9:
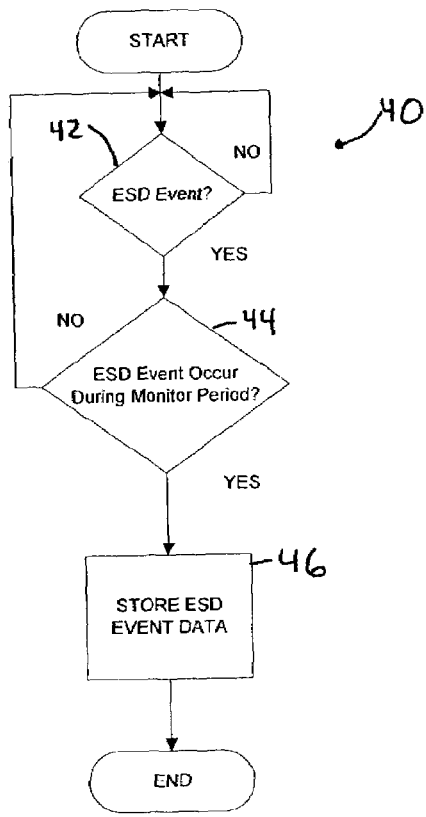
FIG. 9 is a flowchart illustrating a preferred process parameter event gating method in accordance with the invention.

FIG. 8 illustrates more details of the Event Monitoring method that includes the gating process shown in FIG. 7 and FIG. 9 is a flowchart illustrating a preferred process parameter event gating method 40 in accordance with the invention described for an ESD process parameter event. As shown in FIG. 9, the process parameter event monitoring system may determine if an ESD occurrence has occurred in step 42. If an ESD occurrence has not occurred, the method loops back to step 42. If an ESD occurrence occurs, then the system determines if the ESD occurrence occurred during the monitor time period in step 44. The monitor time period (also referred to as the gating signal) may be generated by various methods. For example, the gating signal may be generated by the computer of the process tool based on the operation of the process tool or it may be generated by a portion of the process tool directly, such as by a vacuum relay signal or a pressure value relay, etc. . . If the ESD occurrence did not occur during the monitor time window, then the method loops back to step 42. If the ESD occurrence did occur during the monitor time window, then the ESD occurrence data is stored in step 46 and then forwarded to the tool computer. The method is illustrated in FIG. 8 wherein the IC handler 29 picks and drops integrated circuits. The tool may generate the chip down signal 30 when an IC is picked up or dropped. The process parameter event monitoring system may generate the monitor time window 32 as shown based on the chip down signal. The monitor time window permits the process parameter event monitoring system to filter out spurious ESD occurrences (including electrostatic discharge or electrostatic voltage). As shown in FIG. 8, the various ESD occurrences (including electrostatic discharge or electrostatic voltage) 34 may be captured by the process parameter event monitoring system, but only the ESD occurrences (including electrostatic discharge or electrostatic voltage) during the monitor time windows (the relevant ESD occurrences (including electrostatic discharge or electrostatic voltage) 36) are recorded by the process parameter event monitoring system and forwarded onto the IC handler's computer for processing.

Figure 10:
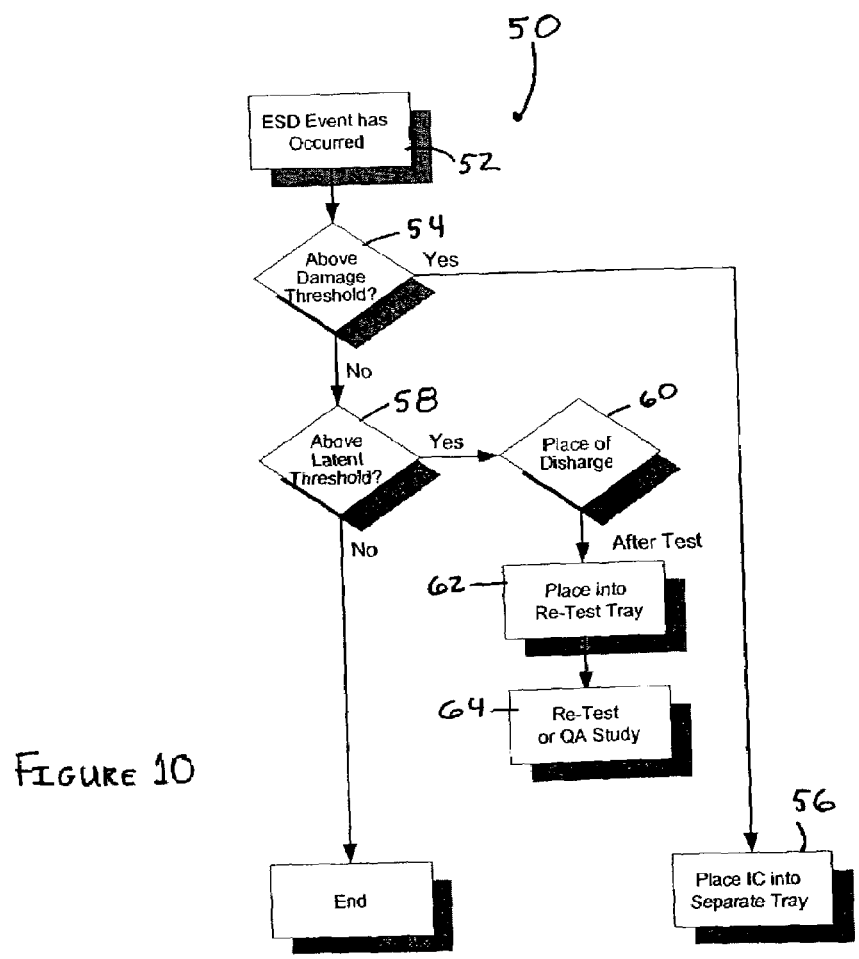
FIG. 10 is a flowchart illustrating the preferred integrated operation of a semiconductor process tool with the process parameter event monitoring system.

In accordance with the invention, the gating method described above permits a process parameter event (such as an ESD occurrence) to be localized to a particular part of the process tool at a particular time. There are also other methods in accordance with the invention for localizing a process parameter event (such as the ESD occurrence) and associating the events with a particular device being processed or a particular portion of the process tool. One alternative technique is to place an additional sensor outside the tool or outside the process area. Then, if this external sensor picks up a process parameter event (such as a discharge) as well, or picks up an event at approximately the same or higher magnitude as the in-situ sensor, it can be safely assumed that this event originates elsewhere and not in the process tool. Another alternative technique for a process parameter monitoring system that is detected ESD occurrences is to associate the detected ESD discharges with the presence or, specifically, change in static voltage at the point of measurements. The sensor described above in this case is capable of receiving static voltage as well as ESD discharges as is described in the co-pending patent application that was incorporated by reference above. A third alternate method is by triangulation of the source based on output of several sensors placed in the equipment. If several sensors pick up the same event, the output from these sensors can differ in magnitude based on distance from the event's origin. A simple well known calculation can determine which sensor was the closest one to the event thus improving localization. Any or all of the alternative techniques may be used independent of the gating method described above. In addition, any or all of the alternate techniques may be used in combination with the gating method described above. Now, the integrated operation of a semiconductor process tool with the process parameter event monitoring system will be described FIG. 10 is a flowchart illustrating the preferred integrated operation 50 of a semiconductor process tool with the process parameter event monitoring system. One of the biggest benefits gained from full integration of Event monitoring in the tool is that the process of sorting out ICs that were exposed to dangerous levels of ESD can be automated and requires no operator assistance. When a test program is entered for each IC, ESD thresholds (damage and latent damage) are also entered as parameters. The software of the handler then sets threshold of Event monitor for each point in accordance with IC damage level and antenna distance from the IC in process. It is recommended that the level determined to cause latent damage be entered as the threshold. This way, all ESD occurrences (including electrostatic discharge or electrostatic voltage) below this level will be discarded by the Event monitor. As an example, the damage level of an IC is set to 200V CDM model and the latent damage threshold is set to 150V CDM. "Chip down" signals for each particular operation are communicated by the handler to Event monitoring system during operation of the handler. Event monitoring system provides IC handler with flow of data corresponding to magnitude of ESD occurrences (including electrostatic discharge or electrostatic voltage) at each particular location.

In step 52, the system determines that an ESD occurrence event has occurred. In step 54, the system determines if the captured ESD occurrence is above the damage threshold. If an IC is exposed to ESD occurrence of stronger magnitude than the damage threshold, then IC handler would automatically place this IC into a separate tray in step 56. In step 58, the system determines if the ESD occurrence is above the latent threshold near the appropriate sensor near the IC in step 60. If the IC experienced a lesser discharge, but still higher than the latent damage threshold, it can be automatically placed in a re-test tray in step 62 for future re-test and analysis by reliability engineer in step 64. Using this integrated process, the customer is assured that no IC that was exposed to excessive ESD levels is shipped to a customer. In addition, if too many high-energy discharges occurred within short period of time, an alarm can sound, indicating problem in the tool and auto shutdown can be executed if desired. In addition, if the frequency of occurrence of weaker discharges is increasing on a tool, it may indicate that this tool may need preventive maintenance before discharges become damaging to the ICs.

If a handler is capable of collecting ESD environment data provided by the process parameter event monitoring system, such data can provide valuable information regarding ESD status of the tools and also provide historical information. For example, if certain batch of ICs is reported as having defects, such as outright failure or latent damage, collected ESD information correlated to a specific tool and date code via process records would provide valuable insights into causes of problem and clues on process improvement. Such record also can be supplied to a customer as evidence of proper ESD environment in the tools during IC manufacturing.

FIGS. 11A and 11B are diagram illustrating examples of the placement of a process parameter sensor 72 of the process parameter event monitoring system relative to a particular part 70 of the semiconductor process tool. In particular, just like other physical parameters such as light and sound, the closer the sensor of the process parameter event monitoring system is to the place of discharge, the stronger signal that it will receive. The better the signal-to-noise ratio, the more reliable detection of a process parameter event. That means that the closer that the antenna is to the place of discharge, the bigger the difference between discharges of interest and the background EMI noise and the higher the probability that detected discharge is related to the IC in process rather than being originated elsewhere. In an IC handler where IC moves from place to place, it is also beneficial to limit distance variations between the IC and the antenna so that the measurements of strength of discharge would be more accurate.

Thus, as shown in FIG. 11A, the sensor 72 is located near the moving arm of the IC handler where ICs are picked up/dropped so that the ESD event during the pick up/drop of the ICs are detected. It is located close to the IC in the process and also its placement on moving robotic arm assures that the distance between the antenna and the IC remains constant. Unique design of sensors allows them to use regular wiring that is already present in the handler, in this particular case in the wire harness of the moving arm itself. This greatly increases flexibility of antenna placement in tools. The control unit collecting data from all the sensors may be installed near the computer of the handler. FIG. 11B shows another example of the placement of the sensor 72 near the source of the potential ESD event (the test socket). Obviously, the sensor may be placed anywhere in the tool in accordance with the invention, but a better placed sensor will result is better detection of process parameter events (for example, ESD occurrences (including electrostatic discharge or electrostatic voltage)).

While the foregoing has been with reference to a particular embodiment of the invention, it will be appreciated by those skilled in the art that changes in this embodiment may be made without departing from the principles and spirit of the invention, the scope of which is defined by the appended claims.

The invention claimed is:

1. An apparatus for monitoring an electrostatic discharge (ESD) occurrence in a semiconductor process tool that affects a device being processed by the semiconductor process tool, the apparatus comprising:
one or more sensors, each sensor being located adjacent to a part of the semiconductor process tool to detect an ESD occurrence near the part of the semiconductor process tool;
a control unit coupled to each sensor, the control unit further comprising a processor that receives the signals from each sensor and generates ESD occurrence signal; and
a semiconductor tool coupled to the control unit, the semiconductor process tool communicating a gating signal to the control unit corresponding to an event of the semiconductor tool which may expose a device to an ESD occurrence so that ESD occurrence signals that do not occur during the gating signal time period are filtered out.

2. The apparatus of claim 1, wherein the gating signal further comprises a time window during which a device is most likely to be exposed to an ESD occurrence.

3. The apparatus of claim 2, wherein the time window further comprises a time period during which the semiconductor process tool is handling the device.

4. The apparatus of claim 1, wherein the semiconductor process tool further comprises a integrated circuit handler.

5. The apparatus of claim 1, wherein the semiconductor process tool further comprises a pick-and-place tool.

6. The apparatus of claim 1, wherein the semiconductor process tool further comprises a photolithography tool.

7. The apparatus of claim 6, wherein the device further comprises a photolithography reticle.

8. The apparatus of claim 1, wherein the processor of the control unit communicates a threshold setting to the sensors so that the sensors filters out ESD occurrences which are less than the threshold setting.

9. The apparatus of claim 1, wherein the processor of the control unit communicates a threshold setting to each sensor so that the each sensor filters out ESD occurrences which are less than the threshold setting for the particular sensor.

10. The apparatus of claim 1, wherein each sensor further comprises a processor that determines if the electrostatic discharge event is greater than a damage threshold value; and
wherein the semiconductor tool automatically places the particular device into a separate tray if the electrostatic discharge is greater than the damage threshold value.

11. The apparatus of claim 10, wherein the processor of each sensor determines if the electrostatic discharge event is greater than a latent threshold value, but less than the damage threshold value; and
wherein the semiconductor tool automatically places the particular device into a separate re-test tray if the electrostatic discharge is greater than the latent threshold value, but less than the damage threshold value.

12. The apparatus of claim 1 further comprising an external sensor located outside of the semiconductor process tool that is connected to the control unit and wherein the control unit processor receives an ESD occurrence signal from the external sensor and determines if the ESD occurrence occurred in the semiconductor process tool by comparing the ESD occurrence signal from a particular sensor in the semiconductor process tool with the ESD occurrence signal from the external sensor.

13. The apparatus of claim 12, wherein the control unit processor determines that an ESD occurrence did not occur in the semiconductor process tool when the magnitude of the ESD occurrence signal from the external sensor is at least equal to the ESD occurrence signal from the particular sensor in the semiconductor process tool.

14. The apparatus of claim 1, wherein the control unit processor determines if the ESD occurrence occurred in the semiconductor process tool at a particular sensor by determining if a change in static voltage occurred adjacent the particular sensor in the semiconductor process tool.

15. The apparatus of claim 1, wherein the control unit processor determines a location of the ESD occurrence in the semiconductor process tool based on a triangulation of the one or more sensors in the semiconductor process tool.

16. An event monitoring apparatus for a process tool, the apparatus comprising:
one or more sensors, each sensor being located adjacent to a part of the process tool to detect an event near the part of the process tool, wherein the event further comprises an electrostatic discharge occurrence and wherein each sensor further comprises a processor that determines if the electrostatic discharge occurrence is greater than a damage threshold value;
a control unit coupled to each sensor, the control unit further comprising a processor that receives the signals from each sensor and generates an event signal and wherein the control unit receives a gating signal from the process tool so that an event signal that does not occur during the gating signal is filtered out; and
wherein the semiconductor tool computer automatically places the particular device into a separate tray if the electrostatic discharge occurrence is greater than the damage threshold value.

17. The apparatus of claim 16, wherein the gating signal further comprises a time window during which a device is most likely to be exposed to an event.

18. The apparatus of claim 17, wherein the time window further comprises a time period during which the process tool is handling the device.

19. The apparatus of claim 16, wherein the process tool further comprises a semiconductor process tool.

20. The apparatus of claim 19, wherein the semiconductor process tool further comprises a integrated circuit handler.

21. The apparatus of claim 19, wherein the semiconductor process tool further comprises a pick-and-place tool.

22. The apparatus of claim 16, wherein the processor of the control unit communicates a threshold setting to the sensors so that the sensors filters out events which are less than the threshold setting.

23. The apparatus of claim 16, wherein the processor of the control unit communicates a threshold setting to each sensor so that the each sensor filters out events which are less than the threshold setting for the particular sensor.

24. The apparatus of claim 16, wherein the event further comprises a pressure event.

25. The apparatus of claim 16, wherein the event further comprises a temperature event.

26. The apparatus of claim 16, wherein the processor of each sensor determines if the electrostatic discharge event is greater than a latent threshold value, but less than the damage threshold value; and
wherein the semiconductor tool computer automatically places the particular device into a separate re-test tray if the electrostatic discharge is greater than the latent threshold value, but less than the damage threshold value.

27. An event monitoring apparatus for a process tool, the apparatus comprising:

one or more sensors, each sensor being located adjacent to a part of the process tool to detect an event near the part of the process tool;

a control unit coupled to each sensor, the control unit further comprising a processor that receives the signals from each sensor and generates an event signal and wherein the control unit receives a gating signal from the process tool so that an event signal that does not occur during the gating signal is filtered out; and an external sensor located outside of the process tool that is connected to the control unit and wherein the control unit processor receives an event signal from the external sensor and determines if the event occurred in the process tool by comparing the event signal from a particular sensor in the process tool with the event signal from the external sensor.

28. The apparatus of claim 27, wherein the control unit processor determines that an event did not occur in the process tool when the magnitude of the event signal from the external sensor is at least equal to the event signal from the particular sensor in the process tool.

* * * * *